United States Patent [19]

Pennebaker et al.

[11] Patent Number: 4,933,883
[45] Date of Patent: Jun. 12, 1990

[54] PROBABILITY ADAPTATION FOR ARITHMETIC CODERS

[75] Inventors: William B. Pennebaker, Carmel; Joan L. Mitchell, Ossining, both of N.Y.

[73] Assignee: International Business Machines Corporation, Armonk, N.Y.

[21] Appl. No.: 193,170

[22] Filed: May 3, 1988

Related U.S. Application Data

[63] Continuation of Ser. No. 805,163, Dec. 4, 1985, abandoned.

[51] Int. Cl.[5] .................. G06F 15/20; H03M 7/40
[52] U.S. Cl. ........................... 364/554; 364/900; 364/919; 364/921.8; 341/107; 341/51; 381/31
[58] Field of Search ............... 364/200, 900, 554; 375/25, 122; 381/3, 30, 31; 341/107, 51

[56] References Cited

U.S. PATENT DOCUMENTS

| | | | |
|---|---|---|---|
| 3,237,170 | 2/1966 | Blasbalg et al. | 341/51 |
| 3,694,813 | 9/1972 | Loh et al. | 364/300 X |
| 3,961,167 | 6/1976 | Mills | 375/25 X |
| 4,053,712 | 10/1977 | Reindl | 381/31 X |
| 4,118,688 | 10/1978 | Glennon | 340/506 X |
| 4,286,256 | 8/1981 | Langdon, Jr. et al. | 341/107 |
| 4,295,218 | 10/1981 | Tanner | 371/45 X |
| 4,325,085 | 4/1982 | Gooch | 358/261 |
| 4,467,317 | 8/1984 | Langdon, Jr. et al. | 341/107 |
| 4,475,227 | 10/1984 | Belfield | 381/30 |
| 4,617,676 | 10/1986 | Jayant et al. | 381/30 X |
| 4,718,027 | 1/1988 | Richardson et al. | 364/554 |
| 4,730,348 | 3/1988 | MacCrisken | 375/122 |
| 4,757,517 | 7/1988 | Yatsuzuka | 375/122 X |
| 4,862,167 | 8/1989 | Copeland, III | 341/107 |

FOREIGN PATENT DOCUMENTS 0154860 9/1985 European Pat. Off. .

OTHER PUBLICATIONS

Gallager, R. G., "Variations on a Theme by Huffman", *IEEE Trans. on Info. Theory*, vol. IT-24, No. 6, Nov. 1978, pp. 668-674.
Glen G. Langdon, Jr. and Jorma Rissanen, "Compression of Black-White Images with Arithmetic Coding", IEEE Trans. Commun. com-29, 858-867, Jun. 1981.
D. R. Helman et al., "Arithmetic Compression Code Control Parameter Approximation", IBM Technical Disclosure Bulletin, vol. 23, No. 11, Apr. 1981.
Glen G. Langdon, Jr. et al., "Method for Converting Counts to Coding Parameters", IBM Technical Disclosure Bulletin, vol. 22, No. 7, Dec. 1979.
Meyer, P., *Introducing Probability and Statistical Applications*, 2nd edition, 1970, pp. 29-29, 66-69, 303-310.

*Primary Examiner*—Parshotam S. Lall
*Assistant Examiner*—Joseph L. Dixon
*Attorney, Agent, or Firm*—M. A. Block; T. P. Dowd

[57] ABSTRACT

The present invention relates to computer apparatus and methodology for adapting the value of a probability of the occurrence of a first of two binary symbols which includes (a) maintaining a count of the number k of occurrences of the first symbol; (b) maintaining a total count of the number n of occurrences of all symbols; (c) selecting confidence limits for the probability; and (d) when the probability is outside the confidence limits, effectuating a revision in the value of the probability directed toward restoring confidence in the probability value. The number of allowed probabilities is, optionally, less than the total number of possible probabilities given the probability precision. Moreover, an approximation is employed which limits the number of probabilities to which a current probability can be changed, thereby enabling the probability adaptation to be implemented as a deterministic finite state machine.

11 Claims, 12 Drawing Sheets

PROBABILITY ADAPTATION FOR ARITHMETIC CODERS

This application is a continuation of application Ser. No. 805,163 filed Dec. 4, 1985 now abandoned.

FIELD OF THE INVENTION

The present invention generally relates to the field of adapting symbol probabilities for binary decisions to reflect probabilities generated from actual decisions. More specifically, the invention involves adapting symbol probabilities in a binary arithmetic coding system.

BACKGROUND OF THE INVENTION

Various phenomena are represented as binary decisions in which one of two decision symbols (such as yes and no) is characterized by one probability (Pr) and the other symbol is characterized by a probability $(1-Pr)$. The less likely symbol is typically referred to as the less (or least) probable symbol LPS whereas the other symbol is referred to as the more (or most) probable symbol MPS.

Generally, the probability Pr is initially determined as an estimate from previous data or an initial estimate based on intuition, mathematics, assumptions, statistics collection, or the like. This estimate may be correct at some times or under some conditions but may not reflect the true probabilities at other times or under other conditions.

In some prior technology, the probabilities are determined before data processing —such as data encoding— and remain fixed. In such prior art, results obtained may be inaccurate because they are not based on current actual data.

In other prior technology, probabilities are evaluated which are intended to reflect data history. One article which discusses such prior art is included in the IBM Technical Disclosure Bulletin in volume 22, No. 7, December 1979, pps. 2880-2882, and is entitled "Method for Coding Counts to Coding Parameters" (by G. G. Langdon, Jr. and J. J. Rissanen). The article states that it is desired to detect changes in the symbol probabilities from observed symbol occurrences, and modify the LPS probability q accordingly. One approach suggested by the article is to change q to reflect the number of counts of one symbol divided by the total number of symbols counted during a symbol string. That is, if k is the counts for one symbol and n is the number of counts for both symbols, symbol probability is changed based on k/n.

Another article by Langdon and Rissanen, "Compression of Black/White Images with Arithmetic Coding", IEEE Transactions on Communications, volume COM-29, No. 6, June 1981, discusses adapting probabilities in an arithmetic coding environment. In discussing adaptation to nonstationary statistics, the IEEE article proceeds on page 865 as follows: "Suppose that we have received r (consecutive) 0's at a state z and our current estimate of the probability of symbol s(i) being 0 is $p=c0/c$... where c0 is a count defined as $c(0|z,s(0),...,s(t))$ and c is a count defined as $c(z,s(0),...,s(t))$. We receive symbol s(i). If s(i) is 0, we test: $p'(r+1) \geq 0.2$? If yes, we regard the observation as being consistent with our estimate of p, and we update c0 and c to form a new estimate... If, however, $p'(r+1) < 0.2$, the observation is likely an indication of changed statistics and we ought to be prepared to change our estimates to a larger value of p. We do this by halving the counts c0 and c before updating them by 1. We do the same confidence test if s(i) is 1 using the probability p(r)... In reality, for the sake of easier implementation, we put suitable upper and lower bounds on the count for the less probable symbol for each skew value Q(s) to indicate when to halve or not the counts." In describing the Q(s) value, it is noted that the IEEE article discusses the approximating of the less probable symbol probability to the nearest value of $2^{-Q(s)}$ where Q(s) is an integer referred to as the "skew number".

Other prior technology includes U.S. Pat. Nos. 4,467,317, 4,286,256, and 4,325,085 and an IBM Technical Disclosure Bulletin article in volume 23, No. 11, April 1981, pps 5112-5114, entitled "Arithmetic Compression Code Control Parameters Approximation" (By. D. R. Helman, G. G. Langdon, Jr., and J. J. Rissanen). The cited references are incorporated herein by reference to provide background information.

SUMMARY OF THE INVENTION

The present invention addresses the problem of providing a computationally simple yet nearly optimum technique for adaptively determining symbol probabilities in a binary decision context. This object is achieved by a method and apparatus for revising the LPS probability (and, hence, the MPS probability) based on confidence limits. Specifically, the present invention includes estimating the LPS probability q and revising the value of q to a value qnew which is just sufficient to bring the LPS probability into known confidence limits after confidence has been lost.

The present invention provides that the number of LPS symbols be counted (as k) and that the number of total symbols (including LPS and MPS symbols) be counted as n. An initial estimate for the value of q is initially set. Based on the estimated value of q, the value of n, a selected confidence level C, and an upper bound (ub) and a lower bound (lb) for k is evaluated. If the actual k is beyond the evaluated bounds, q is assigned a revised value qnew which is the minimal adjustment that places k back within the bounds.

Limiting the change of q to just enter k within the bounds set therefor is of great significance. If qnew were adjusted to simply track k/n, the response time to correct for temporarily eccentric data would be inordinately long. That is, data processing (e.g., data encoding) could proceed for a long period with grossly inaccurate probabilities. The present invention achieves the object of adjusting the q value enough to respond to actual counts, but not enough to deleteriously affect computation time as the result of statistical fluctuations.

In this regard, the present invention is of particular value when processing data with a relatively small number of input samples, especially when q has a value near 0.5. Under such conditions, the confidence approach of the present invention significantly outperforms a technique wherein q tracks k/n.

Preferably, the present invention provides a table which includes a plurality of allowed q value entries selected from all possible entries and ordered by magnitude. In its preferred form, the table has m n-bit entries where $m < 2^n$. Entries are selected such that each has a minimum coding inefficiency for at least one actual probability relative to all other possible estimated probabilities. Entries selected in this way are substantially uniformly spaced (along a logarithmic scale). The smaller table size achieves the object of enhanced computational speeds and a reduction in storage requirements.

Moreover, the invention provides for probability adjustments that include approximations that limit the number of permitted next entries from a subject entry. By reducing the number of next entries, the changes in probability can be implemented in a deterministic finite state machine. When confidence is lost, the q value is shifted to a prescribed entry in the table at which confidence is restored. In that way, the minimal adjustment to q is effectuated to restore confidence. In a preferred mode, based on the measure of lost confidence, a shift of one or more entries may be effectuated at one time.

In accordance with the invention, the bounds for k —namely kmin and kmax—remain constant after they are first evaluated. Thereafter, the level of confidence may be permitted to vary in a known manner to derive updated values for q based on incoming data. This achieves the object of facilitated computations where the bounds remain fixed over time and k need not be measured against sliding boundaries. Alternatively, the number of counts nmax used in determining whether k is less than kmin may be adjusted after a loss of confidence, enabling the confidence level to remain unchanged.

The present invention thus permits the LPS (and, hence, the MPS) probability to be adapted as new data is entered. In this regard, the invention permits probability adjustment during a coding process, such as arithmetic coding.

Moreover, in a specific embodiment, the present probability adaptation is applied to an arithmetic coding system in which range is represented and computed in the logarithmic domain —as is set forth in U.S. Pat. No. 4,791,403, entitled "Log Encoder/Decoder System", and invented by J. L. Mitchell, W. B. Pennebaker, and G. Goertzel (all employees of the IBM Corporation).

DESCRIPTION OF THE INVENTION

1. General Description of Invention

Figure 1:
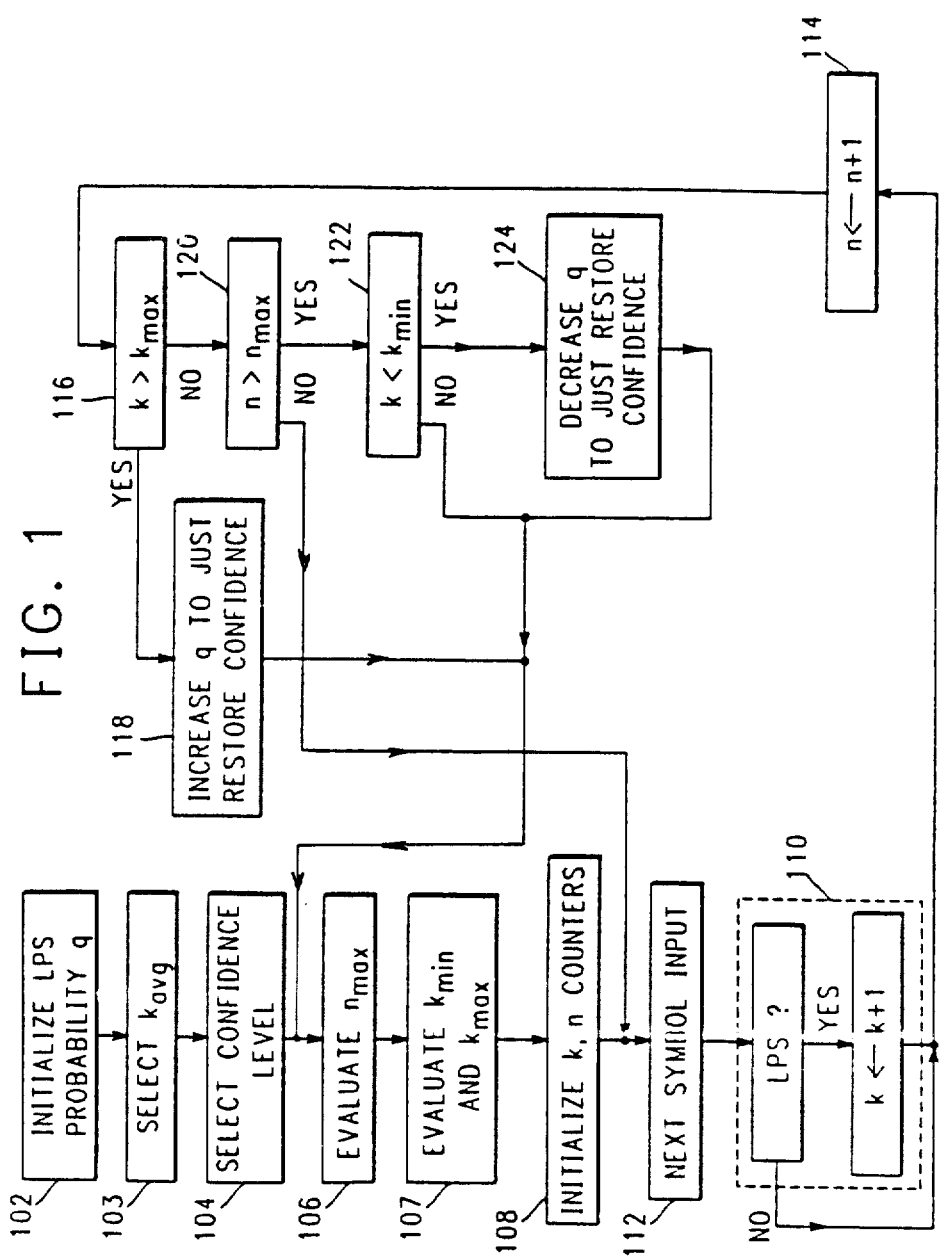
FIG. 1 is a flowchart illustrating the invention in general.

Referring to FIG. 1, a general flowchart shows the steps in adapting a probability q based on the actual symbols of binary decisions. Each decision, it is noted, has two possible outcomes or answers (hereafter referred to as "symbols"). One symbol may represent "0" and the other "1"; or one symbol may represent "black" and the other "white"; or one symbol may represent "yes" and the other "no" depending on context. The more probable symbol at a particular time is referred to as the MPS and the less probable symbol is referred to as the LPS. The LPS symbol probability is identified as q and the MPS symbol probability is identified as p. Accordingly, q is always less than or equal to 0.5.

Such binary decisions are well-known, for example, the occurrence of a white or black symbol for a picture element (pel) in a facsimile system. The probability of a pel being black in a predominantly black background would be expected to be greater than for the pel being white. In this case, the probability of the pel being white is q. Over time or from one background to another, the respective probabilities for the white symbol and black symbol may vary. In this regard, as the background changes from black to white, the probability of a pel being white may switch from being the LPS to the MPS. In accordance with the invention, variations in probability and the switching between LPS and MPS conditions are accounted for.

As seen in FIG. 1, there is an initial estimate for q (and hence for p which is simply $1-q$). If there is no information about the picture background, q and p might be set at 0.5. Generally, however, there is some information suggesting that the probability of q be some lesser value. The initial value for q is entered in step 102.

In step 103, a value for kavg is selected. Kavg is selected to represent an expected LPS count and is typically based on historical data or other relevant information. The value selected is somewhat arbitrary, although the value eight (8) has provided notably good results.

In step 104, a confidence level C is selected. Confidence level is a well-known concept in probability theory. Basically, the confidence level is used in answering the question of how much confidence there is that a given statement is true. In the present invention, the use of a confidence level extends beyond the conventional inquiry of how much confidence there is in a statement. The concept of confidence is further employed as a factor in determining how much q should be adjusted when confidence is lost. Confidence is normally measured as a percentage or probability and herein may be selected with considerable latitude. In step 104, it may be determined that there should be 60% confidence between q and the actual counts that represent an estimate of q.

Once an initial value for q is set and kavg selected, nmax is evaluated in step 106. nmax corresponds to a maximum number of total symbols that are to be examined as a block of data. This number may be arbitrarily selected but is preferably based on the variable kavg. The value nmax is preferably defined as:

$$\text{nmax} = \text{kavg}/q \qquad (1)$$

Related to the confidence level set forth in step 104 are two limits kmin and kmax which are evaluated in step 107. Corresponding to each limit is a confidence bound level lb and ub, respectively, which indicate the likelihood of a k count falling on or outside the kmin or kmax limit. There are several methods for determining these limits.

One technique for evaluating the lower limit kmin and the upper limit kmax relies on the Bernoulli Theorem which is expressed hereinbelow:

$$P(|(k/n)-q|<e)>1-C=1-(pq/ne^2) \quad (2)$$

where
P is the probability that the estimate k/n is within e of the true probability q
p is the MPS probability
q is the LPS probability
k is the LPS count
n is the total symbol count
k/n is the relative frequency —an estimate of q
e is a bound on the magnitude, $|(k/n)-q|$
Solving for the LPS count, k, Equation (2) yields:

$$kmax < nq + (nqp/C)^{.5} \quad (3)$$

$$kmin > nq - (nqp/C)^{.5} \quad (4)$$

The limits as set forth in Equations (3) and (4) are subject to approximations which attend the Bernoulli Theorem. Hence, although they provide some indication of what the limits may be, a more exact and preferred approach is set forth hereinbelow based on the binomial coefficient expression:

$$P_{k,n} = (n!/k!(n-k)!)p^k q^{n-k} \quad (5)$$

From the binomial coefficient expression, a probability $P_{k,n}$ for each k,n pair is readily computed for q. Conceptually, this may be viewed as a table as in FIG. 2. For each table entry, there is a probability corresponding to k LPS symbols occurring out of n total symbols. To determine kmin, a lower confidence bound level lb is set which represents the total probability of k being less than or equal to kmin. For example, the lower confidence bound is selected so that the probability of k being less than or equal to kmin is approximately 0.18. kmin is that k value at which the sum of probabilities for all entries wherein n=nmax and k≦kmin is less than or equal to 0.18.

Mathematically, this relationship is expressed as:

$$\sum_{k=0}^{kmin} P_{k,nmax} \leq .18 \quad (6)$$

Figure 2:
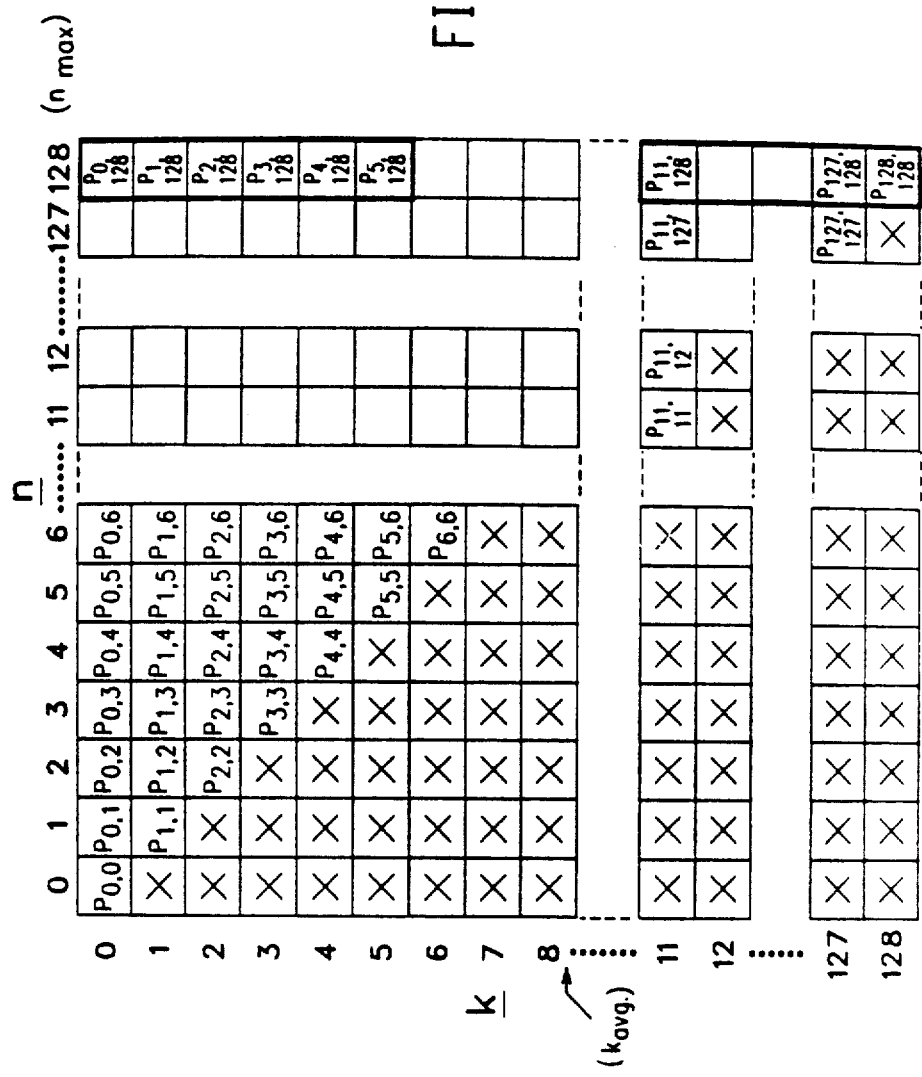
FIG. 2 is an illustration showing probabilities used in probability adaptation according to the present invention.

In the table of FIG. 2, the probabilities that are totalled for kmin=5 are shown with a bold outline in the upper right portion of the table.

In finding kmin, probability sums for each k —starting at k=0—are totalled along the n=nmax column until a k is reached at which the confidence level (e.g. 0.18) is exceeded. The highest value for k at which the confidence level is not yet reached is set as kmin. (In practice, the kmin value may be selected to only slightly exceed confidence.) In FIG. 2, the kmin value occurs at k=5.

To evaluate kmax, a computation is performed based on an upper confidence bound. Again a confidence bound level of approximately 0.18 is considered, by way of example, for the upper bound. For this computation a kmax is sought wherein the probabilities for all entries along the column n=nmax are summed for all k's where kmax≦k≦nmax. By starting at k=nmax, probability sums of successively decreasing k values may be taken until a sum is detected which is greater than .18. The lowest k value at which confidence is not yet reached (i.e., where the sum of probabilities is less than 0.18) is evaluated as kmax at step 107. For kmax=11 and nmax=128, the addend probabilities are shown in the bold outline in the lower right of the table in FIG. 2. Due to the symmetry of the probability distribution, it is observed that kmin is equal or approximately equal to (kavg−Δ) and that kmax is equal or approximately equal to (kavg +Δ). Accordingly, kmax may be readily derived once kmin has been determined.

Figure 3:
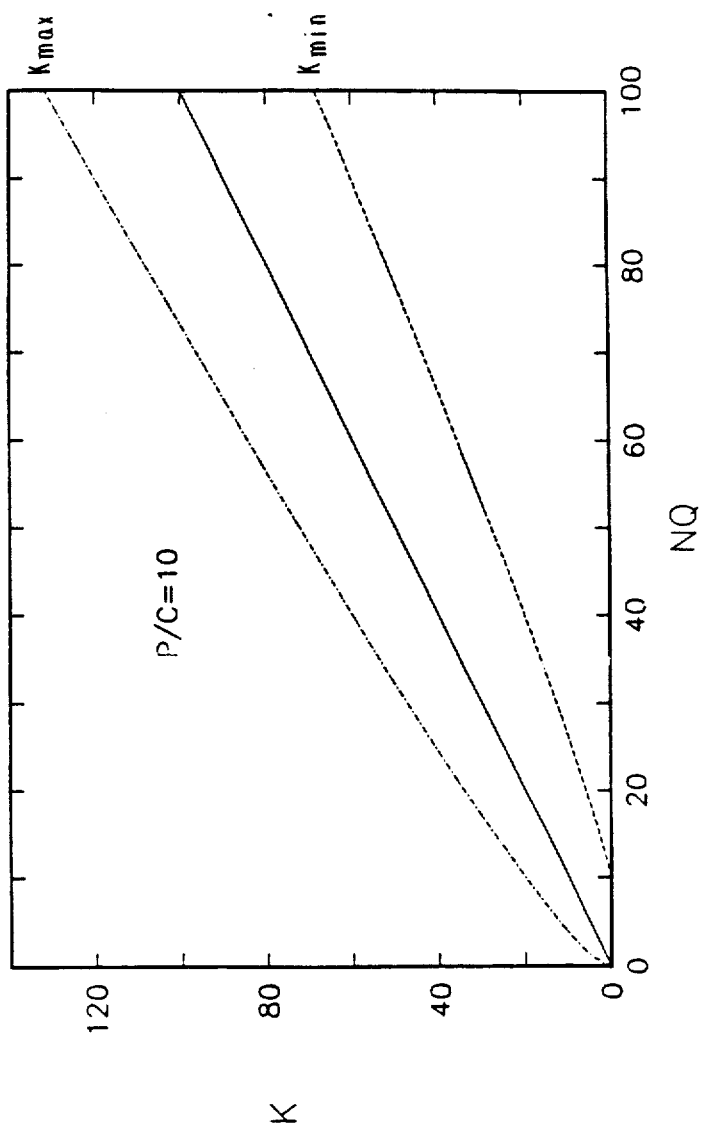
FIG. 3 is a graph showing curves kmin and kmax, on either side of kavg, which indicate the bounds at which confidence is lost under specific conditions.

The values of kmin and kmax are plotted in the graph of FIG. 3 which shows k versus nq. It is noted that the upper bound and lower bound are shown in dashed line representation and correspond to the respective Equations (3) and (4). Referring again to the Bernoulli Theorem, when k and n are small, the true probability that k will exceed a given bound is substantially less than Equation (3) indicates.

In step 108, a k counter and an n counter are initialized to zero. The k and n counts are discussed in greater detail hereinbelow. When initialized to zero, the counters are incremented as appropriate. (As an alternative, the k counter may be set to kmax and the n counter set to nmax. In this alternative approach, each count is respectively decremented until zero is reached. In either case, k and n counts are maintained.)

Given the estimated q, nmax, kmin, and kmax, and initialized counts for k and n, the process of adapting the value of q (and hence p) to better conform to actual symbol data proceeds as follows. At step 112, a next symbol input is entered. With each symbol input, the n count is incremented (if initialized to zero) at step 114. For each symbol input which corresponds to an LPS, the k count is incremented (if initialized at zero) at step 110.

Also, with each symbol input, a comparison is made between k and kmax at step 116. If k is equal to or exceeds kmax, confidence has been lost and q must be adjusted. That is, q is increased in step 118 to a new value (qnew) in order to account for the excessive counts k. With the higher q, the probabilities at the higher end of the table of FIG. 2 increase. In its preferred mode, the present invention provides that —with the new higher q—the values for kmin and kmax remain the same which results in an unchanging value for kavg. Accordingly, based on Equation (1), the value for nmax is reduced.

The adjusting of q to just restore confidence is observed with reference to Tables I and II set forth hereinbelow. Tables I and II are based on Equation (5) which provides for exact calculation of the probability that q is within confidence bounds. In particular, Tables I and II were generated numerically using Equation (5) for values of kavg and a confidence level which simulations have shown give good coding of both fixed and variable statistics files.

TABLE I

| For q = 0.0625, kavg = 8 | | |
|---|---|---|
| confidence level = 0.182426 for kmin = 5, nmax = 128 | | |
| k | qnew | log2(q/qnew) |
| 5. | 0.0625 | 0 |
| 4. | 0.0533 | 0.23 |
| 3. | 0.0439 | 0.51 |
| 2. | 0.0342 | 0.87 |
| 1. | 0.0242 | 1.37 |
| 0. | 0.0133 | 2.24 |

TABLE I-continued

For q = 0.0625, kavg = 8 confidence level = 0.177606 for kmax = 11, nmax = 128

| n | qnew | log2(qnew/q) | log2(nmax/n) |
|---|---|---|---|
| 11. | 0.854 | 4.78 | 3.54 |
| 32. | 0.257 | 2.04 | 2.00 |
| 64. | 0.126 | 1.01 | 1.00 |
| 96. | 0.084 | 0.42 | 0.41 |
| 128. | 0.062 | 0.00 | 0.00 |

TABLE II

For q = 0.5, kavg = 8 confidence level = 0.105057 for kmin = 5, nmax = 16

| k | qnew | log2(q/qnew) |
|---|---|---|
| 5. | 0.500 | 0.00 |
| 4. | 0.436 | 0.20 |
| 3. | 0.368 | 0.44 |
| 2. | 0.297 | 0.75 |
| 1. | 0.219 | 1.19 |
| 0. | 0.131 | 1.93 | confidence level = 0.105057 for kmax = 11, nmax = 16

| n | qnew | log2(qnew/q) | log2(nmax/n) |
|---|---|---|---|
| 11. | 0.815 | 1.43 | 0.54 |
| 12. | 0.716 | 0.81 | 0.41 |
| 16. | 0.500 | 0.00 | 0.00 |

Each of the values of qnew listed in the Tables I and II is the value required to just return to the confidence range, given the value of k and n at which the confidence limit was exceeded.

In the lower portion of Table I, it is observed that if the probability q is to be raised from 0.625 to 0.854 while maintaining approximately 18% confidence at the upper bound, the maximum n value drops from 128 to 11. It is similarly observed that, if q remains unchanged as a result of data inputs, confidence is maintained with the original nmax value of 128.

In Table 11, as in Table I, the upper portion shows the qnew required when k falls below kmin (after nmax total counts) with each respective value 0, 1, 2, 3, 4, or 5. If, after nmax counts, k equals four, q is adjusted to be 0.436 from its initial value of 0.5. Moreover, in the lower portion which relates to k equalling or exceeding kmax, updated values for the maximum n are noted for new increased q values.

In comparing the two Tables I and II, it is noted that both have the same kmin and kmax values but that, for Table I, q is much smaller than for Table II. The probability of each bound being met or exceeded in Table II is much less than for Table I —about 10% as compared to about 18%.

In examining the tables, it is observed that the upper bound of Table I has the same confidence level as the lower bound of Table I. Similarly, the upper bound and the lower bound of Table II have the same level of confidence. This symmetry is not required. If desired, the confidence at the upper bound may be set at one level and the lower bound may be set at another level.

Similarly, the limits kmin and kmax could be adjusted as a function of q to provide a more constant confidence level near q=0.5. Allowing the confidence limits to drop to 10% near q=0.5 does not strongly affect the estimate of q, in that statistical fluctuations are still sufficiently probable.

Figure 4:
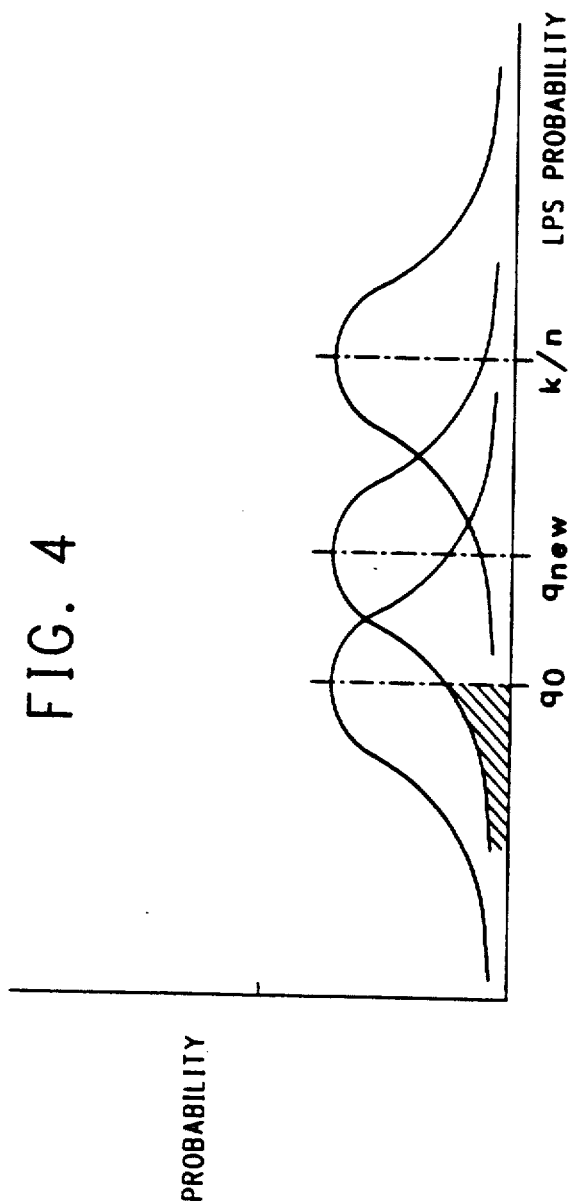
FIG. 4 is an illustration depicting the changing of q to restore confidence.

The significance of just restoring confidence is suggested in FIG. 4. In FIG. 4 the probability distribution for the LPS is shown initially centered on $q_0$. It is then supposed that the actual count ratio k/n for a given block of data is considerably larger than $q_0$. If $q_0$ is increased to k/n, it has been found that inordinate computational requirements may result due to statistical fluctuations. Should $q_0$ in fact be correct, the shifting of the probability curve back to $q_0$ requires an unacceptably long computation time when k/n is tracked.

The present invention provides that the probability curve be shifted to a qnew at which confidence is restored, but k/n need not be followed. If an excessive k is again detected, the curve shifts again in the same direction it has already been shifted. If $q_0$ is in fact correct, the earlier statistical fluctuation is readily accounted for with a relatively small shift of the probability curve back towards a center at $q_0$. In this regard, it is observed that —for a 20% confidence bound at the lower end—the area to the left of $q_0$ is 20% of the area under the qnew curve. Similarly, suppose the k count is k'' after n'' total counts and k'' exceeds kmax, indicating that confidence has been lost at the upper bound. The present invention, by properly selecting an updated probability value qnew for q, shifts the probability distribution of FIG. 4 so that the area under the probability distribution curve (of FIG. 4) to the right of k''/n'' would —for a 20% upper confidence level—be approximately 20% of the total area under the probability distribution curve. The qnew value which achieved this desired shift would become the updated probability value for q.

According to the invention, the new q probability will not be subject to the type of drastic changes which can occur when k/n is tracked. The time during which a grossly inaccurate value for q is used is reduced.

If k does not equal or exceed kmax, a check is made to determine if n equals or exceeds nmax at step 120. If n does not equal or exceed nmax, the next symbol input is entered at step 112. If n does equal or exceed nmax, a determination is made at step 122 as to whether k is less than or equal to kmin. If k is not less than or equal to kmin, there is still confidence at the lower bound and q need not be adjusted.

If k≦kmin, q is decreased sufficiently in step 124 to just restore confidence. The effect of reducing q may be noted in FIG. 2. If q is reduced, the probabilities at the higher k's decrease whereas the probabilities at the lower k values increase. As the probabilities $P_{1,128}$, $P_{1,128}$, $P_{2,128}$, $P_{3,128}$, $P_{4,128}$, and $P_{5,128}$ in the upper right portion of the table increase due to decreasing q, kmin no longer represents a satisfied bound if nmax and the confidence level remain unchanged. To keep the value of kmin constant, nmax is increased. In that way, the k value has more events in which to reach the kmin value.

By maintaining kmin and kmax constant, the k values can be measured against a known fixed value rather than a changing value —thereby facilitating computations.

Whenever q is adjusted, the k and n counts are initialized at step 108. New data is then entered and processed based on the adjusted values of q and nmax.

Tables I and 11 show the ratio of q/qnew or qnew/q in logarithmic form in base-2 (represented by "log2"). This data is used in the context of a logarithmic encoder/decoder in an arithmetic coding system as detailed hereinbelow. It is noted that generally the ratio qnew/q can be approximated by the value of nmax/n.

Only for qnew greater than 0.5 is the approximation poor. This is because log2(qnew/q) is calculated assuming the MPS and LPS symbols are interchanged at q=0.5. The log2(qnew/q) is really two parts, log2(0.5/q) and log2 (qnew/0.5). However, the term qnew/0.5 must be reinterpreted because of the symbol interchange, and that reinterpretation is included in the log2 calculation.

As noted previously, the values of q may be obtained from any of various sources, such as defined tables which include only certain possible or optimum values for q. One technique for forming the q table is set forth hereinbelow.

2. Probability Adaptation in a Log Encoder in an Arithmetic Coding Environment The present invention contemplates embodiments which work with data block sizes (nmax) which can be renormalized rather than simply zeroed at the end of each block (as is described in the above embodiment).

In the present embodiment, it is noted that values for various parameters are stored, in table form, as function "inittbl" set forth in Appendix 1. In particular, values for (a) the log of the probability p (log p); (b) the log of the ratio of probabilities (log q/p); (c) the maximum total count for a particular log of p value (nmaxlp); (d) how the table pointer must be moved to point to a probability value that is half or nearly half the current value (halfi); and (e) how the table pointer must be moved to point to a probability value that is twice or nearly twice the current value (dbli).

In reviewing the table "inittbl", it is observed that each data row comprises ten bytes of data. To move the data pointer from one log p value to the next adjacent value (up or down), the data pointer must be shifted (horizontally) along the length of a data row, e.g. 10 bytes. How far up or down the data pointer is to move depends on how far the new q probability deviates from the previous q value. If k is substantially less than kmin, a halving of q is appropriate and the pointer will be shifted the corresponding number of rows to place the data pointer at the log p value which corresponds to a halving of q. If k reaches kmax at a relatively small value for n, doubling (or even quadrupling) q may be appropriate. If halving or doubling is to be performed, the values set forth in the halfi and dbli columns, respectively, indicate how many bytes the data pointer is to be shifted to effectuate the change. Alternatively, by storing table indices at halfi and dbli for the allowed probabilities, the change from one probability to another probability can be effected without the need for computation. It is observed, in this regard, that an approximation is made in determining qnew to restore confidence. Referring to Table I hereinabove, it is noted that if k=4, when the count n reaches nmax, q should ideally be changed from 0.0625 to 0.0533. Similarly, if k=2 when count n reaches nmax, q should ideally be changed from 0.0625 to 0.0342.

In the presently described embodiment, an approximation for these "ideal" changes is employed. The k value at which the log2 (q/qnew) equals or most closely approximates one is considered a threshold. The occurrence of a k value at or below this threshold prompts movement of the data pointer to a new q value that is at least approximately half the current q value. In Table I, q=0.0625 is changed to 0.0342 if k≦2 when n reaches nmax (given the other conditions of Table I). Moreover, if k is between greater than 2 while less than or equal to 5, q is changed to a value one table position away from 0.0625. Accordingly, the change is based on confidence but includes an approximation.

Similarly, if kmax is equalled or exceeded, the value of log2 (nmax/n) is noted. The value of n at which k equals or exceeds $k_{max}$ and at which log2 (nmax/n) is closest to one represents a first threshold $n_1$. The value of n at which log2 (nmax/n) is closest to two is a second threshold $n_2$. For all values of n greater than or equal to the first threshold (i.e., $n \geq n_1$), q is increased by moving the data pointer one position in the table. For all values of n, $n_1 > n \geq n_2$, the value of q is doubled. In Table I, $n_1 = 64$ and $n_2 = 32$. For all values of $n < n_2$, a quadrupling of q is performed.

An examination of Table I shows that log2 (nmax/n) closely approximates log2 (qnew/q) required to restore confidence, thereby justifying the use of log2 (nmax/n) in determining how much change in q should be made. These approximations achieve the results of directing q toward a new value based on confidence while the number of permitted changes in q is limited. As confidence in the current q becomes worse, q is changed by larger factors in step-wise fashion. By limiting the number of next q's which can be selected, the q changing can be practically implemented as a deterministic finite state machine.

It is noted that the probability adjustments are also approximate in that they depend on the coarseness of the table of allowed values.

The allowed values of the entries listed in the inittbl are determined according to a Log Coder which is described in the aforementioned co-pending patent application. The allowed values, it is noted, are those values which remain after a number of constraints are applied. One technique for defining the allowed values is set forth in the next section.

Flow charts relating to the probability adaptation aspect of the Log Coder are now discussed. Note that the oval headers state the function which follows in the flow chart.

By way of terminology, the probability p is also referred to as P and the probability q as Q hereinbelow. The parameter R relates to range in an arithmetic coding system. In this regard, it is recognized that arithmetic coding normally involves assigning a certain symbol string to a specific range along a number line having a prescribed start point along the line. In the Log Coder, the range R is defined in the logarithmic domain. log R is thus the logarithm of the current range R and LR represents the magnitude of the log of R scaled to finite precision by a constant. LP and LQ similarly represent the magnitude of the log of P and Q scaled to finite precision by the same constant.

Figure 5:
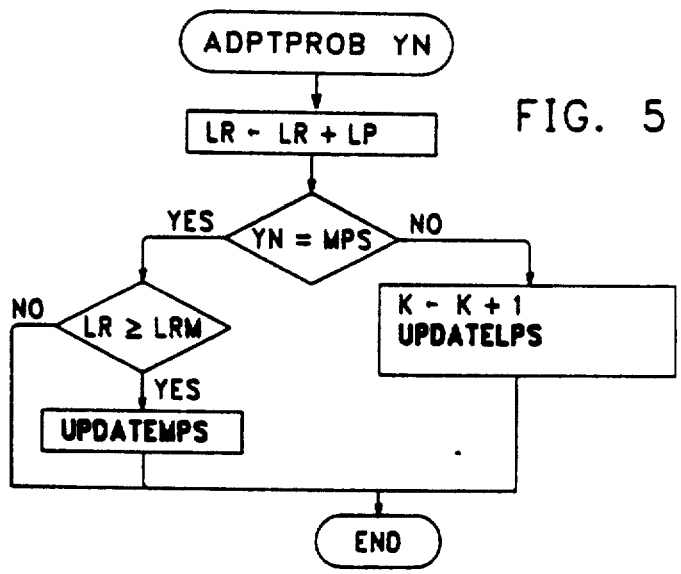
FIG. 5 is a flowchart for a specific binary arithmetic coder embodiment of the invention.

Referring to FIG. 5, a probability estimator flow chart is shown. A scaled logarithmic representation of the range R is updated as LR←LR+LP. This first step corresponds to the range being updated in the logarithmic domain based on the value of the most probable symbol probability. In the general description of the invention, this step corresponds to n←n+1. A decision is then made as to whether the current symbol is an MPS.

If it is, a decision is made as to whether LR is greater than or equal to a predefined maximum value thereof, LRM. If not, no further steps are taken. If so, the MPS is updated according to the flowchart in FIG. 6. Note that LR refers to the same value as n which, in the software set forth in Appendix 1, is counted in units 30 of LP. LRM contains NMAXLP(1) —nmax scaled by LP.

Figure 6:
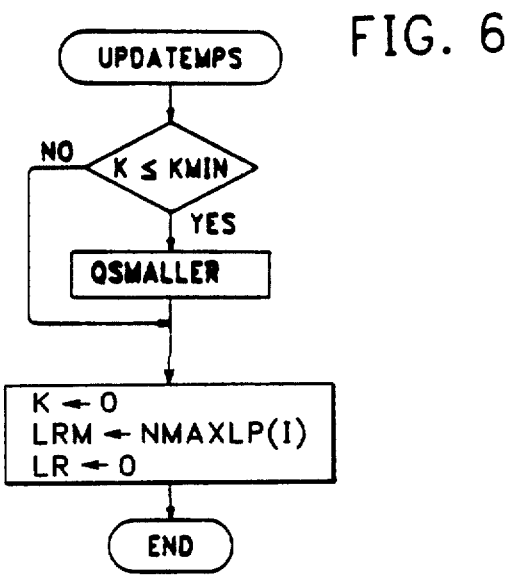
FIG. 6 through FIG. 12 are flowcharts detailing the operations set forth in FIG. 5.
Figure 8:
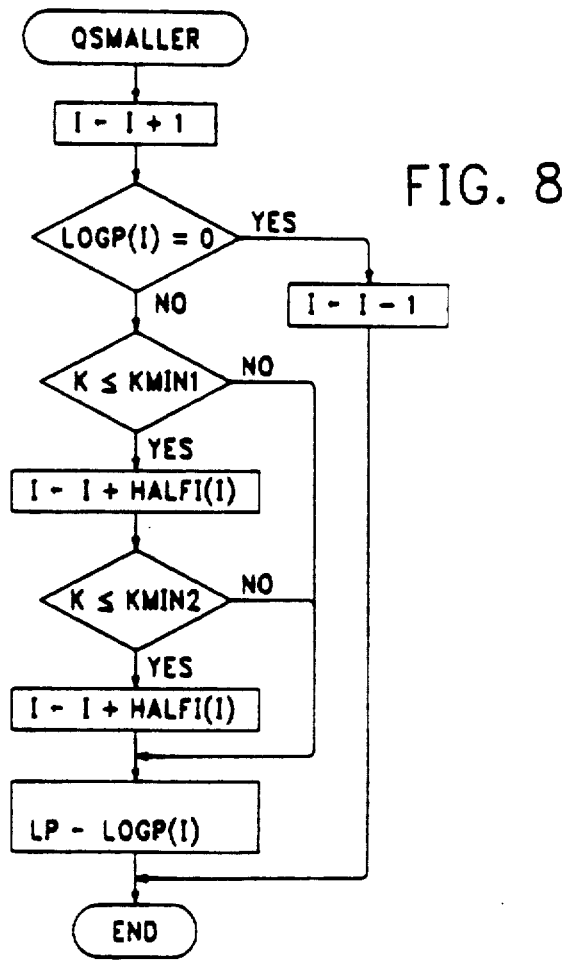

In FIG. 6, UPDATEMPS first provides a test of k≦kmin. If not, k is initialized to zero, LR is initialized to zero, and LRM is set to a value NMAXLP(1). If k is less than or equal to kmin, the probability of q is first decreased according to the subroutine QSMALLER of FIG. 8. That is, if the LPS count k is too small, the probability table pointer I is adjusted to a new position (smaller Q) which restores confidence in the probability estimate. Note that the last entry in the table of log P values is a zero. This is an illegal value which is used as a stop. If zero is encountered the index is backed up to the last valid entry in the table. The value of LP is also updated The comparison of LR with LRM, it is noted, is analogous to the comparison of n with nmax in the general description of the invention.

Figure 7:
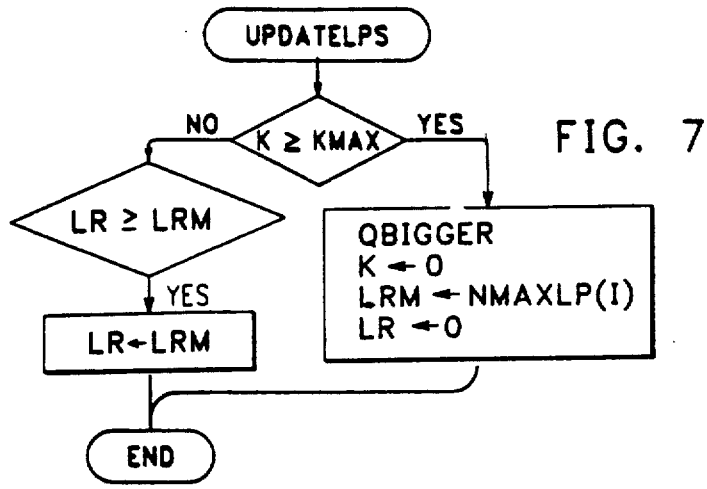
Figure 9:
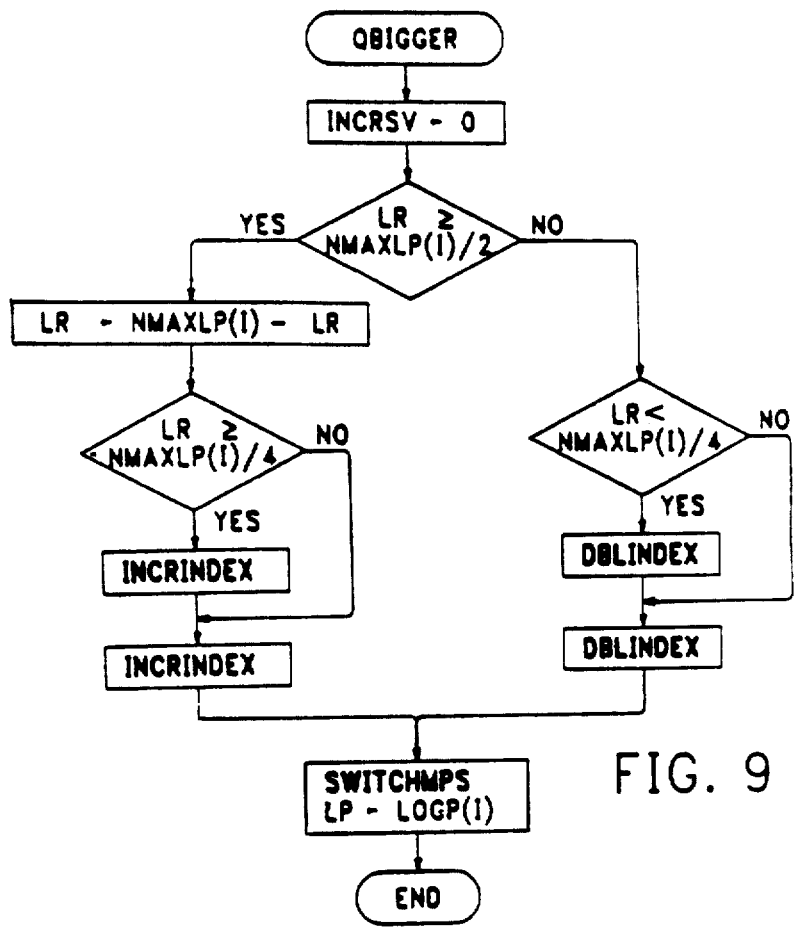

If the symbol is not an MPS, it must be an LPS. The LPS count k is then incremented and the LPS updated according to the UPDATELPS flowchart of FIG. 7. UPDATELPS checks to see if probability adaptation is required by determining if kmax has been reached. If so, QBIGGER of FIG. 9 is called to shift the probability table pointer to a larger Q. Then the LPS count k is zeroed and the block size LRM reset. The event counter LR is reset to zero.

If the current LPS count is within the confidence limits, the total count measure LR is checked to see if it is greater than LRM. If so, it is clamped to LRM.

Figure 10:
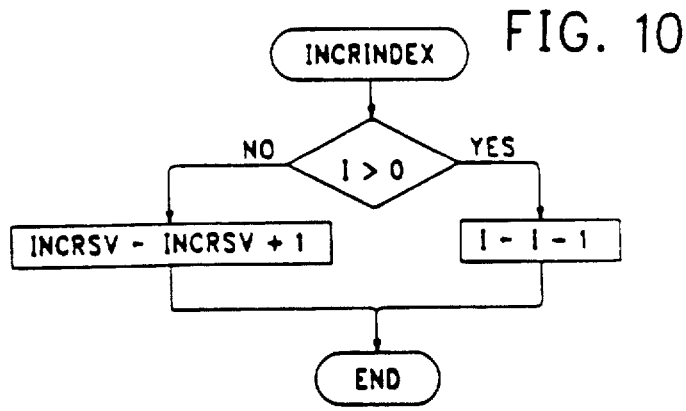
Figure 11:
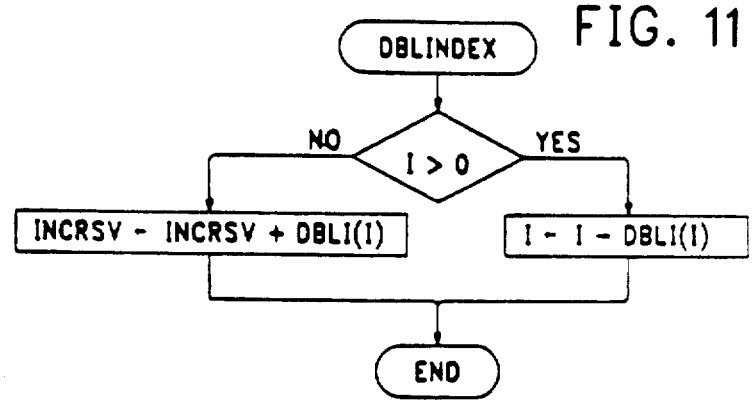
Figure 12:
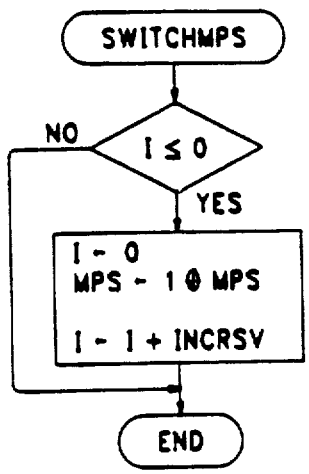

Referring to FIG. 9, QBIGGER moves the probability table index to a larger Q. This action is performed by the routines INCRINDEX of FIG. 10 and DBLINDEX of FIG. 11. Based on the relative values of LR and NMAXPL(1), the index is moved by varying increments as is the corresponding value of Q. INCRINDEX shifts the probability table index to larger Q if possible. DBLINDEX attempts to adjust the probability table index so as to double the value of Q. In both routines, if the Q adjustment cannot be completely done, the remaining index change is saved in INCRSV for use in SWITCHMPS (in FIG. 12).

Figure 13:
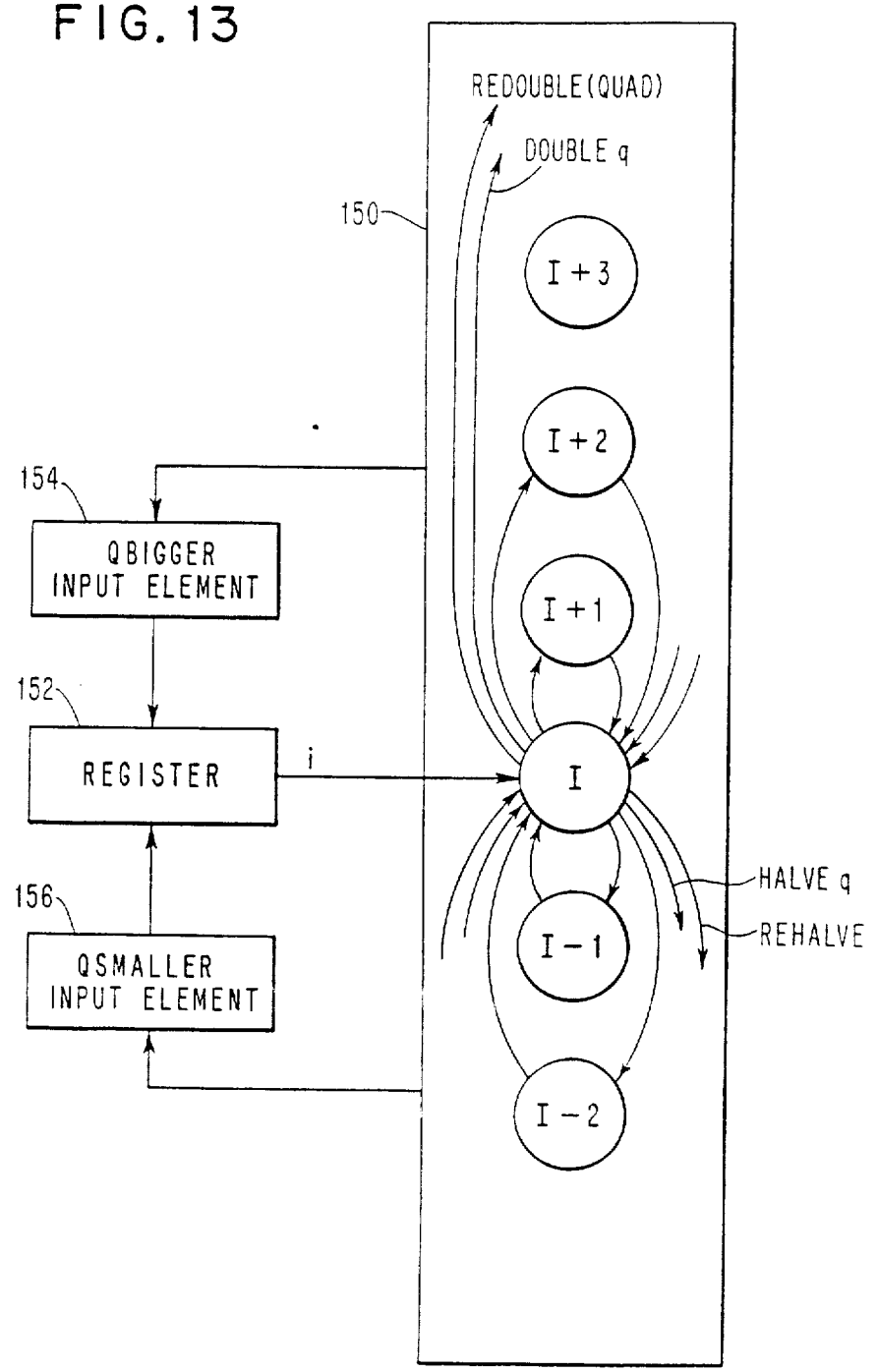
FIG. 13 is a state diagram of a deterministic finite state machine illustrating the probability adjustment process of the invention where various magnitudes of adjustment are provided.

The adjustment of probabilities may be implemented as a deterministic finite state machine such as that shown in FIG. 13. In FIG. 13 the states of the machine are shown as (I−2), (I−1), I, (I+1), (I+2), and (I+3). For purposes corresponding to a current probability. For purposes of discussion, suppose that the probability corresponding to the entry two positions away from state I is half or nearly half of probability of the entry at position I. Suppose that the probability for the entry at position (I+2) represents a doubling of the probability for the entry at position 1. For a modest adjustment to the probability, a movement of the data pointer to an adjacent position is effectuated to either position (I−1) or (I+1) as appropriate. Thus, from state (or position) I, the machine permits the next state (or position) to be (I−2), (I−1), (I+1), or (I+2) as appropriate. This is depicted in FIG. 13 by the transition arrows. By way of example, suppose that the probability at state I is 0.5 and that the probability at state (I−1) is 0.35 and at state (I−2) is 0.25. If k is much less than kmin, q is halved by moving the data pointer to state (I−2).

In examining FIG. 13, it should be recognized that doubling and/or halving need not be confined to movement of the data pointer by two positions. For example, doubling in FIG. 13 could require movement of the pointer from the current state I to position (I+3) instead of position (I+2). The transition arrow from I to (I+2) would thus be replaced by an arrow from I to (I+3). Similarly, halving could be effected by movement of the pointer any number of positions depending on the values of probabilities in the table. In any case, when the pointer moves to a new position, that new position becomes the current state from which a specified one of predefined transitions therefrom is taken depending on the existing conditions.

It is noted that each state ..., (I−2),...,(I+3),... corresponds to a "slot" in a probability table (PROBTBL) stored in a memory table 150. As in APPENDIX I, movement from one slot (corresponding to a respective state) in the memory table 150 to another is implemented using a register 152 —"register i b1 p". It is readily observed that b1 is the name given to a real register which contains the value for the index value i. "p", as readily recognizable by an ordinarily skilled artisan, is an abbreviation for a "pointer variable". In other words, the contents of register b1 points to a particular location in the q probability table (PROBTBL). When the value of the LPS probability q is to be made smaller, the index value i —contained in the register— is adjusted to effectuate a move up to a higher slot (or state) in the table.

The index may be incremented to move up one or two slots or may be incremented to effectuate a doubling or redoubling of the probability value —resulting in varying rates of change for the value of q depending on the degree of loss of confidence. That is, the number of slots moved is based on the measure of lost confidence reflected by the k count. The measure of lost confidence is computed in a QBIGGER element 154, the QBIGGER element determining how the register value i and the probability corresponding thereto is to be adjusted. The value of q is increased by moving the index down a prescribed number of slots (or states) in the memory table 150 based on the relative values of nmax and the count n. The relative values are processed (as discussed in APPENDIX I) by a QSMALLER INPUT element 156 to determine how the value i is to be adjusted.

The arrows in table 150 indicate transitions from a state I to another state. To facilitate viewing, the transitions for only state I are shown —it being recognized that each state has similar transitions extending thereto and therefrom. Table 150 with prescribed next-state transitions corresponds to a deterministic finite state machine. That is, the same final slot (or state) results whenever a given sequence of LPS events and MPS events occur following a given starting slot (or state). The states in FIG. 13 correspond to slots in memory 150 which are indexed based on the value of i in register 152.

If required, QBIGGER also interchanges the definitions of LPS and MPS Since the probability table does not extend beyond Q=0.5, the symbols are interchanged instead. There is thus a discontinuity in the probability adjustment procedure at Q=0.5. This discontinuity is approximately compensated for by saving the unused table index increment in INCRSV and using it (in SWITCHMPS) to adjust the index to a smaller Q after the MPS-LPS interchange. SWITCHMPS checks to see if the probability table index is at the top of the table. If so, it is time to interchange the MPS and LPS symbols. The revised definition of the MPS is stored in the state information, and any unused table adjustment is now added to I to shift the new interchanged Q to a smaller value.

The test sequence and table pointer adjustment algorithm are described in the aforementioned patent application Based on tests, it appears that probability adaptation by just restoring confidence rather than tracking k/n is at least nearly optimum. Moreover, simplicity and computational savings have resulted from employing the technique of just restoring confidence. Appendix 11 sets forth results of tests performed with the embodiment set forth hereinabove.

3. Defining Allowed Probability Values

Figure 14:
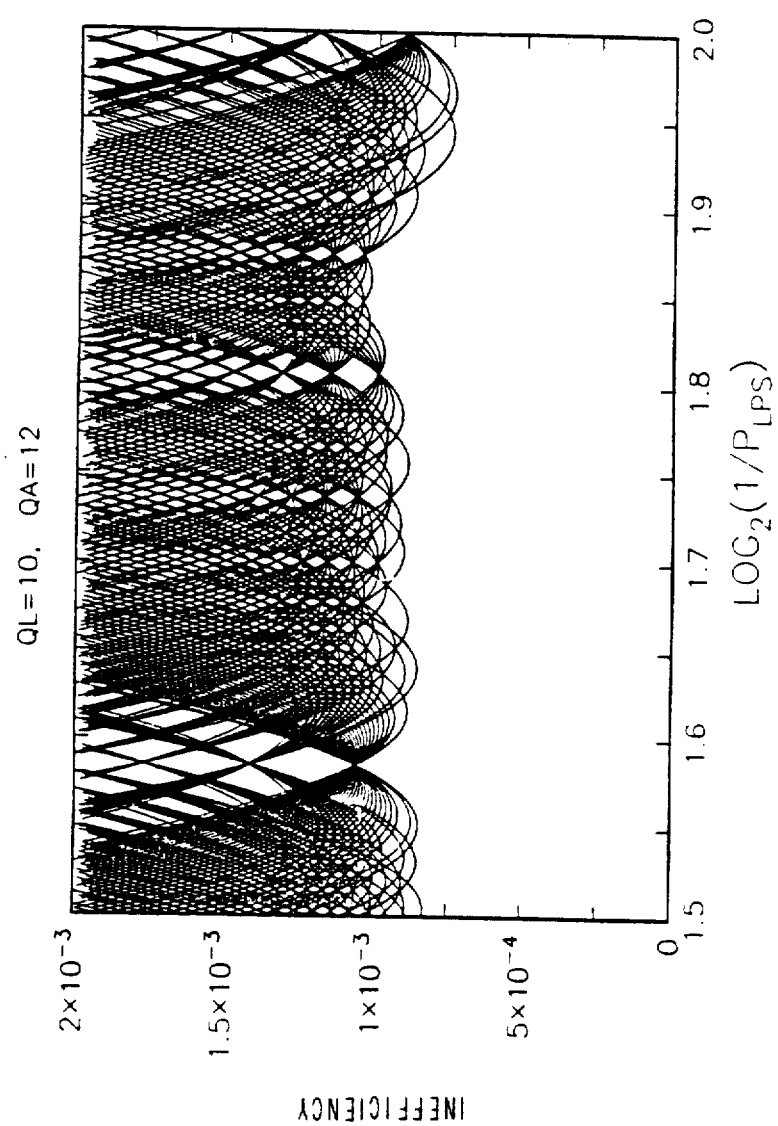
FIG. 14 is an illustration of a plurality of curves showing coding inefficiency relative to the entropy limit for all possible LP values for a sample probability interval.

Although different techniques may be applied in defining allowed probability values, a preferred methodology is noted with reference to FIG. 14. In FIG. 14, a plurality of curves are shown, each curve representing the coding inefficiency for a probability value.

It is initially noted that if probability is based on 10-bit precision, there are $2^{10}$ (or 1024) different possible probability value entries. FIG. 14 includes curves for all possible probability values for a sample probability interval.

For each possible entry, there is an Entropy defined as:

$$\text{Entropy} = -P\log2(P) - Q\log2(Q)$$

where $(P+Q=1)$. Entropy is represented in terms of bits/symbol for ideal coding. A "Bit Rate" is also defined as:

$$\text{Bit Rate} = -P\log2(P_{est}) - Q\log2(Q_{est})$$

where $(P_{est} + Q_{est}) \leq 1$. The "Bit Rate" is represented as bits per symbol for the estimated probabilities.

For a given possible probability value, there is then defined a corresponding coding inefficiency characterized as:

$$\text{INEFFICIENCY} = \frac{\text{Bit Rate} - \text{Entropy}}{\text{Entropy}}$$

QL and QA represent the log and antilog precisions, respectively. The relative error for the various probabilities is defined as the coding inefficiency as set forth hereinabove.

FIG. 14 depicts coding inefficiency along the ordinate and a probability-related value along the abscissa.

A first step in reducing the number of allowed probabilities is to retain a probability only if it has an inefficiency curve with a value at a given point along the abscissa that is less than the value of all other curves at that given point. That is, each probability that does not define a minimum relative to all other curves, at a given abscissa value, is not an allowed value.

A second step in reducing the number of allowed probabilities includes setting a maximum inefficiency value along a defined range of abscissa values. The leftmost curve—remaining after the first step—is followed upward and to the right of its minimum until it intersects another curve at a point above the set maximum inefficiency.

The intersection immediately preceding the intersection that exceeds the set maximum is noted, and the curve corresponding thereto is selected as the second allowed probability (The probability for the leftmost curve is the first allowed probability.) The second allowed probability is then similarly followed until it intersects a curve above the set maximum. The preceding intersection is noted as is the curve corresponding thereto, the probability of that curve being the third allowed probability. Successive probabilities are similarly determined. In FIG. 14, the threshold is set at 0.002.

Figure 15:
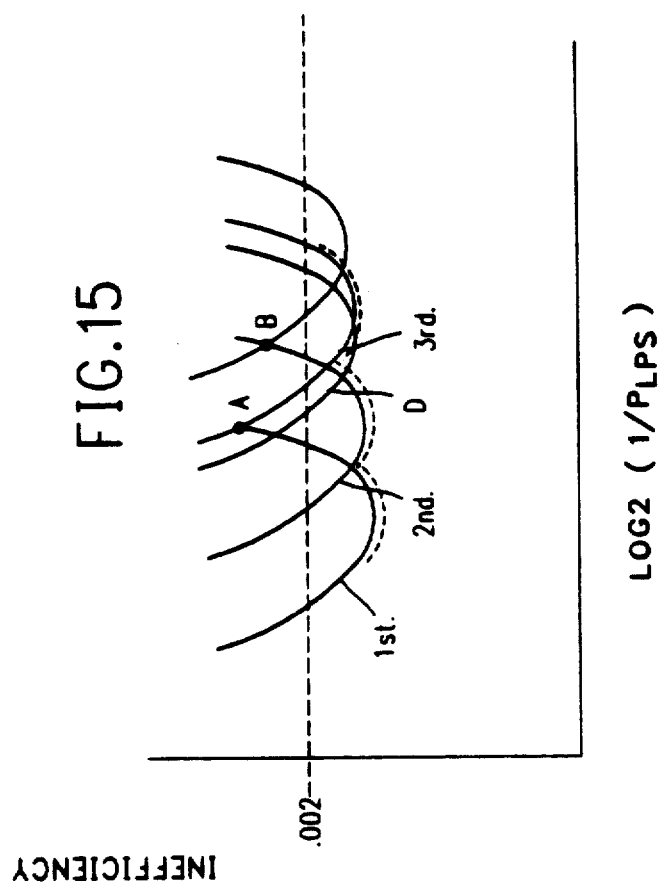
FIG. 15 is an illustration showing the selection of allowed probability values from among the possible probability values based on a given inefficiency coding limit.

The second step is exemplified in FIG. 15. The first curve is followed to first intersection point A that exceeds the maximum inefficiency of 0.002. The second curve is then tracked to intersection point B. The third curve is then followed and so on. The respective probabilities corresponding to the first, second, and third curves are retained. The probability corresponding to curve D is discarded.

The last step involves retaining all curves which are retained in the first step and which are outside the range set forth in the second step. The range terminates preferably at the abscissa point beyond which no curves have inefficiencies below the maximum, e g., .002.

The above-noted algorithm achieves tremendous reduction in the number of allowed probabilities while at the same time achieving substantial uniformity along the log probability scale. That is, for 10-bit precision, the original 1024 possible probabilities have been reduced to 48 allowed probabilities which are—over the above-mentioned range—substantially uniformly spaced along a log probability scale.

Figure 16:
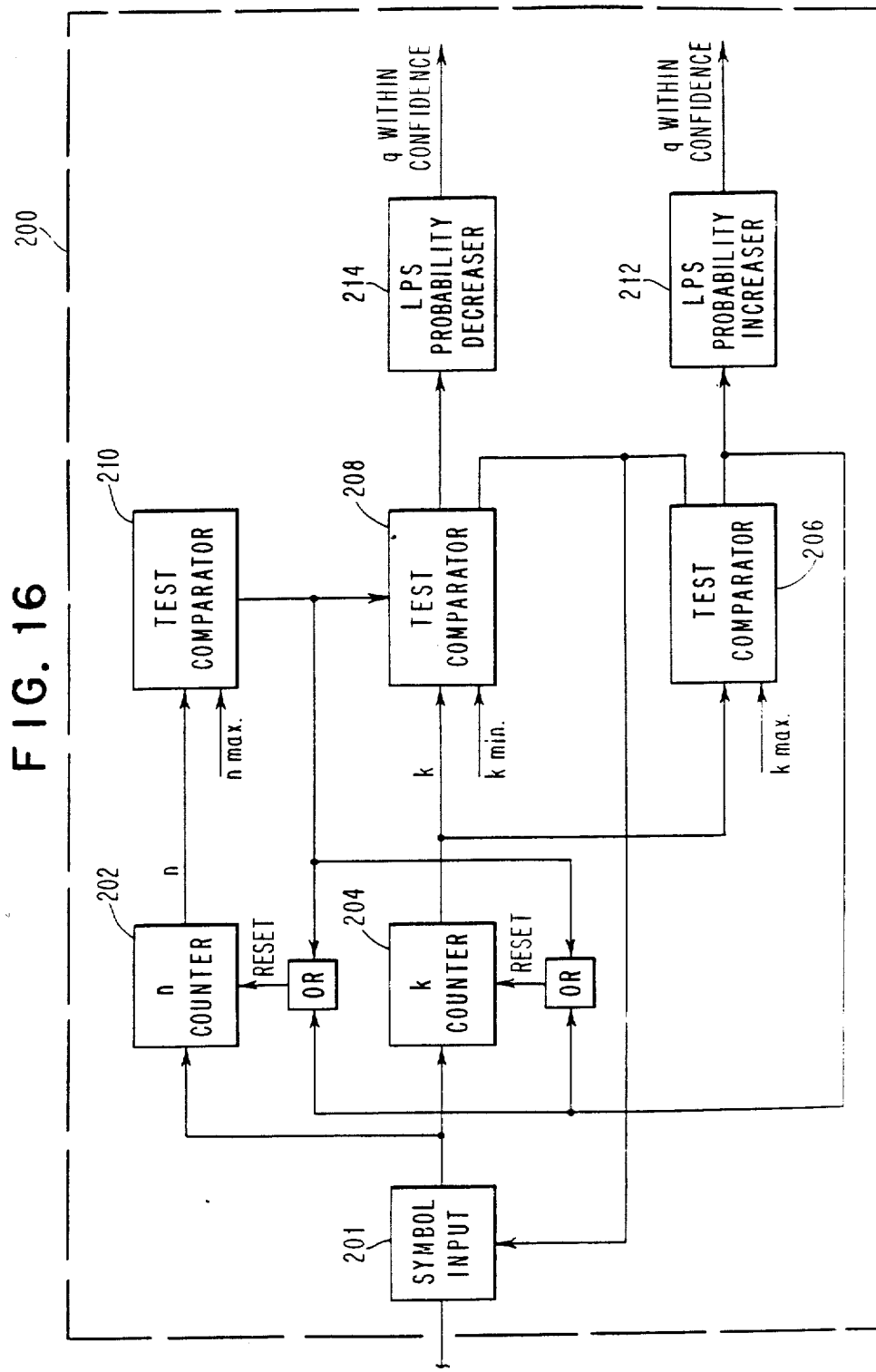
FIG. 16 is a block diagram illustrating a probability adaptor apparatus according to the invention.

One embodiment of the present invention is illustrated in FIG. 16. The probability adapter 200 has a symbol input which enters MPS and LPS decision events as inputs. Each symbol input enters a first counter 202 which counts all events, such as black and white pixel events, the total count being labelled n. A second counter 204 maintains a count for each LPS event, the LPS count being k. The k count is tested against a prescribed upper confidence limit kmax in element 206 and against a lower confidence limit kmin in element 208. A method of computing kmin and kmax is set forth hereinabove. A third element 210 tests n against a prescribed limit nmax. When k>kmax in element 206, an LPS probability increaser 212 acts to augment the value of q to be within confidence. Also when k>kmax in element 206, counters 202 and 204 are reset to zero. Moreover, when k<kmin in element 208 and element 210 signals that n>nmax, q is reduced in value by LPS probability decreaser 214 bring q within confidence. Also when k<kmin and n>nmax, the two counters 202 and 204 are reset. If neither confidence limit is breached, a next symbol is entered wtihout a change in the value of q. The estimation process is adaptive, the value of q being changed whenever a confidence limit is breached.

4. Alternative Embodiments

While the invention has been described with reference to preferred embodiments thereof, it will be understood by those skilled in the art that various changes in form and details may be made without departing from the scope of the invention.

For example, although a kavg of 8 has provided good results, experiments with other values ranging from 4 to 14 indicate that the choice of both kavg and the confidence limit is not critical. It is, however, important to not over-estimate the change in q, as this will lead to an excessive sensitivity to statistical fluctuations and "hunting".

Also, although each q is described as having its own $P_{k,n}$ table, these values may alternatively be computed on the fly as when a new q value is determined.

A more elegant embodiment for probability adaptation avoids dependence on the structure of the probability table. In this alternative approach, it is recognized that tables I and II contain the log2 of the ratio of the old and new q values—a total ratio. If each entry in the table of allowed probabilities also contains a parameter dlogq (the log of the ratio of the q for this entry and the q for the entry above), the table has the following columns: log p, log q/p, nmaxlp, lgnmaxlp, and dlogq. The required new position in the corresponding table of allowed probabilities can be readily reached as follows Subtract the dlogq for the current entry from the total ratio which yields a new total ratio. The next adjacent dlogq value (in the appropriate up or down direction) is subtracted from the new total ratio and so on until the new total ratio is zero —at which point the correct table position has been reached. Accordingly, if for example, q is to be made smaller, the process requires a very simple lookup table to obtain the required log2(q/qnew) for any given k value. Then as the pointer to the probability table is shifted to the next smaller q, dlogq is subtracted from the log of the ratio. When the log of the ratio is zero, the correct table position has been reached.

With regard to making q larger it is recognized that log2 nmax/n is a good approximation to log qnew/q. A good approximate value of log2 nmax/n can be obtained as follows: the Log Coder counts symbols in units of log2 p, where the log is scaled by a factor of 1024 to allow integer arithmetic. If the symbol count n is in units of log2 p, the value of nmax (in units of log p) does not vary more than a factor of two over the entire allowed range of p (log p from 1 to 1024). Consequently, an approximate value of log n can readily be derived from a simple lookup table, and the value of log nmax can be stored directly in the probability table itself as lgnmaxlp. The difference then provides a good estimate of log2 qnew/q. This estimate of log2 qnew/q is decremented by dlogq as the probability table pointer is moved toward larger q.

Furthermore, the algorithm for reducing the number of table entries (e.g., from 1024 to 48) may include other steps without departing from the scope of the invention as claimed. Depending on application, for example, the selection of allowed probabilities may differ.

Crossing the q=0.5 bound requires special handling. Because the log nmax/n is an underestimation of log qnew/q after the redefinition of LPS and MPS, any remainder in log qnew/q is doubled to approximately correct for the underestimation when the crossing occurs.

Still further, the present invention contemplates as an equivalent alternative that the bounds be defined so that kmin and kmax are still within confidence. In such an embodiment, confidence is exceeded when k>kmin when nmax is exceeded, and when k>kmax. In this regard, the k<kmin condition may be examined when n=nmax or, alternatively, when n first exceeds nmax. Similarly, with regard to the $n_1$ and $n_2$ thresholds, the triggering condition may include or, alternatively, exclude the case where $n=n_1$ or where $n=n_2$, respectively. Such variations, it is readily observed, are governed by the teachings of the present invention.

The alternative embodiments provide results comparable with those achieved by the simple embodiment specified hereinabove.

Appendix I

PDS code implementation of the probability adaptation scheme. Note that forward polish notation is used so an operator is followed by its operands.

```
function adptprob yn(w);
    (called for each symbol to be encoded)
    n = +n lp                   (count the events in the confidence
                                 interval)
    if yn=mps                   (symbol = most probable symbol)
        codemps                 (sum the bits to code a mps)
        if n lge expl nmax      (if event count large enough)
            updatemps           (check n for mps update)
        endif
    else                        (symbol = least probable symbol)
        k = +k 1                (increment lps count)
        codelps                 (sum the bits to code a lps)
        updatelps               (update q if needed)
    endif
endfn
replace tdi; 10 endrepl
register i bl p
    replace qsmaller;
        i= +i tdi               :(next slot in probtbl)
        if logp=0               :(if end of table)
            i= −i tdi           :(back up)
        else                    :(see if q should be even smaller)
            if k  >kminl        :(really confident interval wrong)
                i= +i expl halfi :(half of present q in table)
                if k  >kmin2    :(absolutely sure interval wrong)
                    i= +i expl  :(halve q again)
                    halfi
                endif
            endif
            lp=expl logp        :(update counting unit)
        endif
    endrepl
    replace switchmps;
        if i lle probaddr       :(MPS change - fell off end of
                                 table)
            i=probaddr          :(force back in range)
            mps=eor mps 1       :(interchange def of MPS)
            i= +i incrsv
        endif
    endrepl
    replace dblindex;
        if i lgt probaddr
            i= −i expl dbli
        else
            incrsv= +incrsv expl dbli
        endif
    endrepl
    replace incrindex;
        if i lgt probaddr
            i= −i tdi
        else
            incrsv= +incrsv tdi
        endif
    endrepl
    replace qbigger;
        incrsv=0
        if n llt expl srl nmaxlp 1    :(if n < ½ nmax)
            if n llt expl srl nmaxlp 2 :(if n < ¼ nmax)
                dblindex
            endif
            dblindex
        else
            n= −expl nmaxlp n          :(amount left)
            if n lge expl srl          :(if (nmax−n) >= ¼ nmax)
                nmaxlp 2
                incrindex
            endif
            incrindex                  :(next slot in probtbl)
        endif
        switchmps
        lp=expl logp                   :(update counting unit)
    endrepl
    replace updatemps;
        if k  > kmin               :(if fluctuation encountered)
            qsmaller
        endif
        k=0                        :(zero lps count)
        n=0                        :(zero interval event count)
    endrepl
```

Appendix I-continued

PDS code implementation of the probability adaptation scheme. Note that forward polish notation is used so an operator is followed by its operands.

```
replace updatelps;
    if k    < kmax            :(if fluctuation encountered)
        qbigger
        k=0
        n=0
    else
        if n lgt expl nmax    :(if at end of block)
            n=expl nmax       :(clamp n - in coder, clamp
                                difference)
        endif
    endif
endrepl
replace codelps;
    bits= +bits expl +lqp logp
endrepl
replace codemps;
    bits= +bits expl logp
endrepl
```

The following function is used to regenerate the lookup tables. Most of the code would be required once the adaptation parameters are frozen.

```
function inittbl;
    (initiallize parameters for the adaptation test)
    float tem;
    pointer isv;
    word isvv blv;
    half nmaxdbl;
    half logpisv(base isv);
    half nmaxisv(base isv+4);
    static
        half probtbl(250);
    (initiallize probability tables)
        (* log p    log q/p    nmaxlp    halfi      dbli *)
    init probtbl
```

| * log p | log q/p | nmaxlp | halfi | dbli |
|---|---|---|---|---|
| 1024 | 0 | 16384 | hex 50 | hex 00 |
| 895 | 272 | 16110 | hex 50 | hex 0a |
| 795 | 502 | 15105 | hex 46 | hex 14 |
| 706 | 726 | 14826 | hex 46 | hex 1e |
| 628 | 941 | 14444 | hex 46 | hex 28 |
| 559 | 1150 | 13975 | hex 3c | hex 32 |
| 493 | 1371 | 13804 | hex 3c | hex 3c |
| 437 | 1578 | 13547 | hex 3c | hex 46 |
| 379 | 1819 | 13265 | hex 3c | hex 50 |
| 331 | 2044 | 13240 | hex 3c | hex 46 |
| 287 | 2278 | 12915 | hex 3c | hex 46 |
| 247 | 2521 | 12844 | hex 3c | hex 3c |
| 212 | 2765 | 12720 | hex 3c | hex 3c |
| 186 | 2971 | 12648 | hex 3c | hex 3c |
| 158 | 3227 | 12482 | hex 3c | hex 3c |
| 143 | 3382 | 12441 | hex 3c | hex 3c |
| 127 | 3566 | 12319 | hex 3c | hex 3c |
| 110 | 3788 | 12320 | hex 3c | hex 3c |
| 98 | 3965 | 12250 | hex 3c | hex 3c |
| 84 | 4200 | 12180 | hex 50 | hex 3c |
| 72 | 4435 | 12168 | hex 5a | hex 3c |
| 65 | 4590 | 12155 | hex 64 | hex 3c |
| 59 | 4737 | 12154 | hex 64 | hex 3c |
| 53 | 4899 | 12084 | hex 64 | hex 3c |
| 48 | 5050 | 12096 | hex 64 | hex 3c |
| 45 | 5147 | 12105 | hex 64 | hex 46 |
| 42 | 5250 | 12096 | hex 64 | hex 50 |
| 40 | 5325 | 12080 | hex 5a | hex 50 |
| 37 | 5441 | 12062 | hex 5a | hex 5a |
| 35 | 5527 | 12075 | hex 5a | hex 5a |
| 33 | 5617 | 12078 | hex 50 | hex 64 |
| 30 | 5758 | 12060 | hex 46 | hex 64 |
| 28 | 5863 | 12068 | hex 46 | hex 64 |
| 26 | 5976 | 12090 | hex 3c | hex 64 |
| 23 | 6157 | 12075 | hex 3c | hex 64 |
| 21 | 6295 | 12075 | hex 3c | hex 64 |
| 19 | 6447 | 12103 | hex 32 | hex 5a |
| 17 | 6616 | 12121 | hex 32 | hex 50 |
| 15 | 6806 | 12150 | hex 28 | hex 46 |
| 13 | 7024 | 12181 | hex 28 | hex 3c |
| 11 | 7278 | 12221 | hex 1e | hex 3c |
| 9 | 7585 | 12294 | hex 1e | hex 32 |
| 7 | 7972 | 12411 | hex 1e | hex 28 |
| 5 | 8495 | 12615 | hex 1e | hex 1e |
| 4 | 8884 | 13120 | hex 14 | hex 1e |
| 3 | 9309 | 13113 | hex 14 | hex 1e |
| 2 | 10065 | 14574 | hex 0a | hex 14 |
| 1 | 11689 | 21860 | hex 00 | hex 0a |
| 0 | 0 | 0 | 0 | 0; |

```
kmin2=0
kmin1=1
kmin=5
kavg=8
kmax=11
b1=addr probtbl
(generate nmax from logp and lqp values in Table above)
begin
    if logp  =0
        tem= *floatit expl kavg power 2 /floatit expl +lqp logp 1024.
        nmax=expl fixit floor +0.5 tem
        nmx=nmax
        km=kmax
        km= *logp km
        nmax= *logp nmax
        b1= +b1 tdi
    repeat
    endif
endbegin
b1=addr probtbl
(generate index for nmax halved (q doubled))
begin
    if logp  =0
        isv=b1
        nmaxdbl=srl nmx 1 (nmax required is half current nmax)
        begin
            if isv llt addr probtbl
                isv= +isv tdi
                leave
            endif
            if nmaxisv < nmaxdbl
                leave
            endif
            isv= -isv tdi
        repeat
        endbegin
        dbli=expl -b1 expl isv (delta to table where q doubled)
        b1= +b1 tdi
    repeat
    endif
endbegin
b1=addr probtbl
(generate index for nmax doubled (q halved))
begin
    if logp  =0
        isv=b1
        nmaxdbl=sll nmx 1
        begin
            if nmaxisv > nmaxdbl
                leave
            else
                isv= +isv tdi
                if logpisv=0
                    isv= -isv tdi
                    leave
                else
                    repeat
                endif
            endif
        endbegin
        km= +kmax kmin1
        km= *logp km
        nmax= *logp nmax
        halfi=expl -isv expl b1 (delta to point where q halved)
        b1= +b1 tdi
    repeat
    endif
endbegin
b1=addr probtbl
probaddr=b1
bpst=addr cbuffer
mps=1
k=0
```

-continued
```
n=0
    lp=expl logp
endfn
Storage definitions:
based b1
    half logp;           (log p at index i)
    half lqp;            (log q/p, used to determine efficiency)
    half nmaxlp;         (nmax in units of log p)
    half nmax(at nmaxlp);
    half halfi;          (pointer to q halved)
    half dbli;           (pointer to q doubled)
common
    word mps;            (most probable symbol value - 0 or 1)
    word yn;             (symbol to be coded)
    word bits;           (count bits for adaption test)
    word n;              (event count)
    word nlp(at n);      (event count in lp units)
    word lr(at nlp);     (magnitude log of the range, same as nlp)
    half k;              (short term lps count)
    half kmax;           (upper limit of confidence interval)
    half kavg;           (average lps count for confidence interval)
    half kmin;           (lower limit of confidence interval)
    half kmin1;          (if k >, shift table index til nmax 2x)
    half kmin2;          (if k >, shift table index til nmax 4x)
    half nmxsv;          (used in switchmps)
    word x;              (finite precision window on code stream)
    word lp;             (log p)
    word lr;             (log of the range)
    word lrm;            (maximum lr before change index)
    pointer probaddr;    (address of probtbl)
    word incrsv;
```

Appendix II. Test Results

The following experiments were made using a set of 11 test files created using a random number generator. Nine of the files had fixed statistics with q probabilities from 0.5 to 0.0001. Two files had six short (1024 symbol) blocks, with varying probabilities from block to block. One file (p6.19) changed the probability from 0.1 to 0.9 on alternate blocks; the other (p6.501) changed the probability from 0.5 to 0.01 on alternate blocks. Note that the log2 values in the confidence limit calculation results have been multiplied by 1024.

The fixed statistics results were split into two halves (65535 symbols in each half). In the first half the overhead for adapting from a starting probability of 0.5 is included. The second half therefore is the true fixed statistics coding rate. The 'ideal' coding rate is the optimum coding rate that can be achieved by the Log Coder; this is within 0.2% of the entropy limit. Note that statistical fluctuations can sometimes produce better than 'ideal' coding rates.

Test 1: kmin = 5, kavg = 8, kmax = 11
See Tables I and II for confidence calculations.
Adaptation According to the Specified Embodiment
kmin2 = 0, kmin1 = 1, kmin = 5, kavg = 8, kmax = 11

| file | 1st half | | 2nd half | | % inefficiency |
|---|---|---|---|---|---|
| | coded | ideal | coded | ideal | |
| p6.19 | 3168 | 2882 | | | 9.92 |
| p6.501 | 3590 | 3320 | | | 8.13 |
| p0.5 | 65820 | 65536 | 65832 | 65536 | 0.45 |
| p0.25 | 53591 | 53367 | 53366 | 53096 | 0.51 |
| p0.1 | 30970 | 30826 | 30795 | 30697 | 0.32 |
| p0.05 | 18792 | 18740 | 18676 | 18623 | 0.28 |
| p0.01 | 5303 | 5260 | 5180 | 5167 | 0.25 |
| p0.005 | 3166 | 3109 | 2949 | 2939 | 0.34 |
| p0.001 | 928 | 875 | 763 | 757 | 0.79 |
| p0.0005 | 510 | 464 | 448 | 452 | 0.8 |
| p0.0001 | 239 | 190 | 87 | 87 | 0.00 |

Test 2: kmin = 10, kavg = 14, kmax = 18
Confidence limit calculations:

For q = 0.0625
confidence level=0.167177 for kmin=10., nmax=224.

| k | qnew | log2(q/qnew) |
|---|---|---|
| 10. | 0.0625 | 0 |
| 9. | 0.0573 | 127 |
| 8. | 0.0522 | 265 |
| 7. | 0.0472 | 415 |
| 6. | 0.0420 | 588 |
| 5. | 0.0367 | 787 |
| 4. | 0.0313 | 1020 |
| 3. | 0.0259 | 1303 |
| 2. | 0.0202 | 1665 |
| 1. | 0.0144 | 2172 |
| 0. | 0.0079 | 3046 | confidence level=0.165822 for kmax=18., nmax=224.

| n | log2(nmax/n) | qnew | log2(qnew/q) |
|---|---|---|---|
| 18. | 3724 | 0.9050 | 5523 |
| 56. | 2047 | 0.2558 | 2081 |
| 112. | 1024 | 0.1258 | 1033 |
| 168. | 424 | 0.0835 | 427 |
| 224. | 0 | 0.0624 | 2 |

Adaptation According to the Specified Embodiment
kmin2 = 1, kmin1 = 4, kmin = 10, kavg = 14, kmax = 18

| file | 1st half | | 2nd half | | % error |
|---|---|---|---|---|---|
| | coded | ideal | coded | ideal | |
| p6.19 | 3304 | 2882 | | | 14.64 |
| p6.501 | 3722 | 3320 | | | 12.11 |
| p0.5 | 65785 | 65536 | 65770 | 65536 | 0.36 |
| p0.25 | 53546 | 53367 | 53235 | 53096 | 0.26 |
| p0.1 | 30914 | 30826 | 30765 | 30697 | 0.22 |
| p0.05 | 18789 | 18740 | 18653 | 18623 | 0.16 |
| p0.01 | 5319 | 5260 | 5184 | 5167 | 0.33 |
| p0.005 | 3168 | 3109 | 2955 | 2939 | 0.54 |
| p0.001 | 970 | 875 | 758 | 757 | 0.13 |
| p0.0005 | 563 | 464 | 445 | 452 | 1.5 |
| p0.0001 | 276 | 190 | 87 | 87 | 0.00 |

Test 3: kmin = 2, kavg = 4, kmax = 6
Confidence calculations:
For q = 0.0625
confidence level = 0.228699 for kmin = 2., nmax = 64.

| k | qnew | log2(q/qnew) |
|---|---|---|
| 2. | 0.0625 | 0 |
| 1. | 0.0432 | 544 |
| 0. | 0.0228 | 1488 | confidence level = 0.20969 for kmax = 6., nmax = 64.

| n | log2(nmax/n) | qnew | log2(qnew/q) |
|---|---|---|---|
| 6. | 3496 | 0.7702 | 4219 |
| 16. | 2047 | 0.2572 | 2089 |
| 32. | 1024 | 0.1260 | 1035 |
| 48. | 424 | 0.0835 | 427 |
| 64. | 0 | 0.0624 | 3 |

Adaptation According to the Specified Embodiment
(kmin2 not used), kmin1 = 0, kmin = 2, kavg = 4, kmax = 6

| file | 1st half | | 2nd half | | % error |
|---|---|---|---|---|---|
| | coded | ideal | coded | ideal | |
| p6.19 | 3052 | 2882 | | | 5.90 |
| p6.501 | 3521 | 3320 | | | 6.05 |
| p0.5 | 66038 | 65536 | 66080 | 65536 | 0.83 |
| p0.25 | 54051 | 53367 | 53752 | 53096 | 1.24 |
| p0.1 | 31115 | 30826 | 31013 | 30697 | 1.03 |
| p0.05 | 18938 | 18740 | 18817 | 18623 | 1.04 |
| p0.01 | 5322 | 5260 | 5190 | 5167 | 0.45 |
| p0.005 | 3157 | 3109 | 2974 | 2939 | 1.19 |
| p0.001 | 931 | 875 | 766 | 757 | 1.19 |
| p0.0005 | 500 | 464 | 452 | 452 | 0.00 |
| p0.0001 | 231 | 190 | 87 | 87 | 0.00 |

We claim:

1. A computer-implemented method of adapting the probability of the occurrence of a first of two binary symbols in response to the actual occurrence of a series of binary events each indicative of a physical entity and represented by either of the two symbols, comprising the steps of:

recording and maintaining in a first counter a total count of the number n of occurrences of events corresponding to all symbols;

recording and maintaining in a second counter a count of the number k of occurrences of the first symbol event;

storing in computer memory a plurality of possible probability values;

selecting from the probability values stored in the computer memory a current probability value for the first symbol;

selecting and storing a confidence level;

selecting and storing a k/n probability distribution of all possible k/n values, such that said selected probability distribution is distributed about the current probability value and has an upper confidence bound and a lower confidence bound based on the selected confidence level;

evaluating and storing a minimum k value, kmin, a maximum k value, kmax, and a maximum n value, nmax, based on the current probability value and the two confidence bounds;

generating a first signal when the count in said first counter becomes $n'' \geq nmax$;

generating a second signal when the count in said second counter becomes $k'' \geq kmax$;

testing said second counter in response to the generation of a first signal and when the count is $k' \leq kmin$, generating a third signal for selecting from the computer memory an updated probability value and redistributing the selected probability distribution about the updated probability value, such that when the selected probability distribution is redistributed about said updated probability value, k'/nmax and a lower confidence bound ofd the redistributed probability distribution are at least approximately equal; and testing said first counter in response to the generation of a second signal and generating a fourth signal, when the count n'' in said counter is $\leq nmax$, for selecting from the computer memory an updated probability value and redistributing the selected probability distribution about the updated probability value, such that when the selected probability distribution is redistributed about said updated probability value, k''/n'' and a higher confidence bound of the redistributed probability distribution are at least approximately equal.

2. The method of claim 1 wherein the selecting step includes:

evaluating a kmin as a function of the probability, a selected maximum value for n, and a first confidence factor;

kmin representing a lower limit for the k count after the n count reaches the maximum value thereof;

evaluating a kmax as a function of the probability, the maximum value for n, and a second confidence factor;

kmax representing an upper limit for allowable values of k; and wherein the revision step includes adjusting the value of the probability, when k is less than or equal to after n reaches the maximum value therefor or when k is greater than or equal to kmax, by the minimal increment necessary to place k within the upper and lower limits therefor.

3. The method of claim 2 wherein the step of evaluating kmin includes the step of: representing kmax according to the expression:

$$kmax < nq + (nqp/c)^{0.5}$$

and kmin by the expression:

$$kmin > nq - (nqp/C)^{0.5}$$

where q is the probability for the first binary symbol and p is a second probability corresponding to the second binary symbol and where the first confidence factor and the second confidence factor each has a prescribed value C.

4. The method of claim 1 wherein the evaluating of kmin and kmax includes the steps of:

calculating probabilities for each of a plurality of values of k,n pairs according to the expression:

$$P_{k,n} = (n!/k!(n-k)!) p^k q^{n-k}$$

setting the value of kmin as the highest k value at which $$\sum_{k=0}^{kmin} P_{k,nmax} \leq lb$$

setting the value of kmax as the lowest value of k at which $$\sum_{k=kmax}^{nmax} P_{k,nmax} \leq ub$$

where lb is a lower confidence level bound and ub is an upper confidence level bound; and where q is the probability for the first symbol and p is a second probability corresponding to the second symbol;

both q and p assuming new values qnew and pnew respectively pursuant to the revision step.

5. In an adaptive arithmetic coding system, apparatus for adjusting an estimated probability value for a least probable symbol (LPS) to maintain the probability q within the limits of a known degree of confidence while successive symbol inputs, each corresponding to a physical entity, are coded, the apparatus comprising:

first counter means for tracking and recording a total number of symbol inputs n;

second counter means for tracking and recording the number of LPS symbols input k;

first testing means, connected to said second counter means, for producing a first signal each time k exceeds a prescribed maximum value kmax based on the known degree of confidence;

second testing means, connected to said first counter means, for producing a second signal each time n exceeds a prescribed maximum value nmax;

third testing means for testing said second counter means in response to each second signal from said second testing means, to determine if k exceeds a prescribed minimum value kmin based on the known degree of confidence, and producing a third signal indicative of the failure of k to exceed kmin;

means for storing a current value of the estimated LPS probability q utilized in coding said symbol inputs;

increasing means, connected to said storing means and responsive to a first signal from said first testing means, for producing a fourth signal increasing the current value of the estimated LPS probability q each time k exceeds said kmax value, to a value q+ which just restores confidence in the probability estimate of q and for zeroing said first and second counter means thereupon;

decreasing means, connected to said storing means and responsive to a second signal from said second testing means and a third signal from said third testing means, for producing a fifth signal decreasing the current estimated LPS probability q to a value q− which just restores confidence in the probability estimate, each time k is less than said kmin value and n exceeds the nmax value and for zeroing said first and second counter means thereupon;

means, connected to said storing means and respectively responsive to said fourth signal or said fifth signal, for adjusting said storing means to store said respective resulting estimated probability value, q+ or q−, as the current estimated probability for coding the next symbol input; and means, connected to said storing means, for utilizing the respective stored resulting estimated probability value, q+ or q−, as the current estimated probability for coding the next symbol input.

6. A machine-implemented method of adapting the probability of the occurrence of a less probable symbol, LPS, in a binary arithmetic coding system to correspond to its occurrence in a stream of symbols representing physical entities, while said stream is actually being coded, the method comprising the steps of:

for a current value of the LPS probability q, computing and storing a first confidence level and a second confidence level;

detecting and counting the symbols generated;

recording and maintaining in a first counter a total symbol count n;

recording and maintaining in a second counter a less probable symbol LPS count k;

prescribing and storing a maximum value kmax and a minimum value kmin based on a preselected expected count value kavg, the current q value, and the computed confidence levels;

comparing the value of k with said prescribed maximum value kmax each time an LPS binary symbol is counted and generating a first signal when k≥kmax;

comparing the value of n with a prescribed maximum value nmax each time a symbol is counted and generating a second signal if n exceeds the nmax value;

comparing k with said prescribed minimum value kmin in response to the generation of a second signal and generating a third signal each time k is less than said kmin value;

storing in machine memory a plurality of possible LPS probability values where each possible k count for n events has a computed probability associated therewith;

increasing the value of q, in response to the generation of a first signal, to the probability value in the memory which corresponds to the minimal increment which results in the sum of probabilities for all possible counts for k ≥ kmax being less than the first confidence level;

decreasing the value of q in response to the generation of a third signal to the probability value in the memory which corresponds to the minimal decrement which results in the sum of probabilities for all possible counts for k≤kmin being less than the second confidence level;

initializing the first counter and second counter following the increasing or decreasing of the value of q and before resuming detecting and counting; and for the next symbol generated, repeating the preceding steps with the current value of q being that resulting after the most recent iteration of said proceding steps, in coding said stream of symbols.

7. The method of claim 6 comprising the further step of:

maintaining the value of kmin and the value of kmax as q is updated to new values.

8. The method of claim 6 comprising the further steps of:

representing each q value in the logarithmic domain; determining optimum values of q in the logarithmic domain and retaining only the optimum values;

wherein said q increasing step and said q decreasing step each includes adjusting q from one retained value to another.

9. The method of claim 8 comprising the further step of:

maintaining kavg, kmin, and kmax constant as q changes; and adjusting nmax according to the relationship nmax = kavg/q.

10. The method of claim 9 comprising the further step of:

forming respective values of $P_{k,n}$ for each retained q value wherein $$P_{k,n} = (n!/k!(n-k)!)p^k q^{n-k}$$

based on the $P_{k,n}$ values for each q, selecting a minimal change in the value of q such that for a constant kavg, kmin, and kmax and for a corresponding nmax according to the expression nmax=kavg/q, the following expressions applies:

$$\sum_{k=0}^{kmin} P_{k,nmax} \leq lb$$

$$\sum_{k=kmax}^{nmax} P_{k,nmax} \leq ub$$

wherein lb is a lower bound confidence level and ub is an upper bound confidence level.

11. In a computer-implemented arithmetic coding system wherein each string of binary decision events representing physical entities is assigned to (i) a respective range R along a number line and (ii) a codepoint in said respective range R, and wherein the value of R and the codepoint for R are subject to adjustment with the occurrence of each decision event, and wherein the range and codepoint therefor are updated with each successive decision event based on (i) a current value of R, (ii) a current value for an estimated probability q for one of the two binary decision events, and (iii) whether the decision event for which the range and codepoint are being updated corresponds to a decision event associated with the q probability, a computer-implemented method for adapting q based on actual decision events for use in the arithmetic encoding of a string of actual decision events comprising the steps of:

(a) storing in a computer memory a table of q values;

(b) storing in memory a value LR which is a logarithmic representation of a current value of the range R;

(c) incrementing the value LR by a logarithmic representation of one of the decisional probability values and storing the incremented LR in memory;

(d) detecting whether the decision input for which the range and codepoint are being updated corresponds to a q-type event corresponding to the q probability or to a non-q type event and maintaining a count k which increments with successive detected q-type events;

(e) storing in memory a maximum total count value LRM, at least one q-type event minimum count value kmin, and a q-type event maximum count value kmax;

(f) detecting if $LR \geq LRM$ when a non-q type event is detected in step (d) and generating a first signal when $LR \geq LRM$;

(g) detecting whether $k \leq kmin$ when a first signal is generated, and generating a second signal when $k > kmin$ and a third signal when $k \leq kmin$;

(h) resetting to zero the values of k and LR when a second signal is generated;

(j) moving a pointer in memory from an entry corresponding to the current q value to an entry having a smaller q value when a third signal is generated;

(k) incrementing the value of k and detecting whether $k \geq kmax$ when the decision event is a non-q type event in step (d), and generating a fifth signal when $k \geq kmax$ and a sixth signal when $k \leq kmax$;

(l) when a fifth signal is generated,
  (i) resetting k and LR to zero and
  (ii) moving the pointer in memory from an entry corresponding to the current q value to an entry having a larger q value; and (m) detecting whether $LR \geq LRM$ when a sixth signal is generated and, if so, resetting LR to the value of LRM;

and applying the value for q after steps (a) through (m) in the arithmetic coding of subsequent decision data until the pointer is moved again in response to a subsequent decision event input.

* * * * *